(12) United States Patent
Janik

(10) Patent No.: US 7,521,946 B1
(45) Date of Patent: Apr. 21, 2009

(54) ELECTRICAL MEASUREMENTS ON SEMICONDUCTORS USING CORONA AND MICROWAVE TECHNIQUES

(75) Inventor: Gary R. Janik, Palo Alto, CA (US)

(73) Assignee: KLA-Tencor Technologies Corporation, Milpitas, CA (US)

(*) Notice: Subject to any disclaimer, the term of this patent is extended or adjusted under 35 U.S.C. 154(b) by 115 days.

(21) Appl. No.: 11/277,934

(22) Filed: Mar. 29, 2006

Related U.S. Application Data

(60) Provisional application No. 60/669,196, filed on Apr. 6, 2005.

(51) Int. Cl.
*G01R 31/302* (2006.01)

(52) U.S. Cl. .................. 324/750; 324/752; 324/753

(58) Field of Classification Search .............. None
See application file for complete search history.

(56) References Cited

U.S. PATENT DOCUMENTS 5,453,703 A * 9/1995 Goldfarb .................. 324/765
6,011,404 A * 1/2000 Ma et al. .................. 324/765
7,285,963 B2 * 10/2007 Talanov et al. ............. 324/635
2005/0231187 A1 10/2005 Kwark

OTHER PUBLICATIONS

Narasimhan: "Taking Control Of The Copper Process At 65 nm", KLA-Tencor Corporation, Spring 2004, Yield Management Solutions, pp. 23-30.

* cited by examiner

*Primary Examiner*—Minh N Tang
(74) *Attorney, Agent, or Firm*—Bever, Hoffman & Harms, LLP; Jeanette S. Harms

(57) ABSTRACT

A corona-microwave system can generate accurate capacitance-voltage (C-V) and resistance-voltage (R-V) curves, thereby allowing the accurate determination of gate film capacitance, sheet resistance of implanted regions, and mobility of a substrate under a gate. The corona-microwave system can combine a corona deposition system, a Kelvin probe, and a microwave probe. The corona deposition system can deposit a corona charge on a surface of the semiconductor. The Kelvin and microwave probes can be used to make first and second electrical measurements of a layer/region of the semiconductor. The steps of charge deposition and probe measurements can be repeated to generate a curve plotting the first and second electrical measurements. Because the first and second electrical measurements can be accurately made, the extracted information from the curve is also accurate.

10 Claims, 10 Drawing Sheets

ELECTRICAL MEASUREMENTS ON SEMICONDUCTORS USING CORONA AND MICROWAVE TECHNIQUES

RELATED APPLICATIONS

This application claims priority of U.S. Provisional Patent Application 60/669,196, entitled "New Technique For Electrical Measurements On Semiconductors" filed Apr. 6, 2005.

BACKGROUND OF THE INVENTION

1. Field of the Invention

The invention relates to the field of semiconductor metrology, and in particular, to an improved system and method for performing various electrical measurements using combined corona and microwave techniques.

2. Related Art

Various electrical measurements can be done on a semiconductor wafer to determine the performance characteristics of the devices formed on that semiconductor wafer. Exemplary electrical measurements include capacitance, sheet resistance (i.e. the resistance of very thin doped regions in a substrate), and mobility (i.e. the relationship between resistivity and charge density (resistivity/charge density) associated with the surface of stressed (using compression or tensile forces) silicon). Each of these electrical measurements has conventionally been performed using different techniques (and correspondingly different equipment). Unfortunately, each of these techniques has entailed significant disadvantages.

FIG. 1A illustrates a technique 100 that can measure the capacitance versus voltage of a gate film (e.g. an oxide or dielectric). In technique 100, a series of corona charges can be deposited on the gate film in step 101. FIG. 1B illustrates an exemplary corona bias in which a corona charge generator 112A can produce ions 112 that deposit precise amounts of charge 113 on a gate film 111. In one embodiment, the area of gate film 111 designated for charge deposition can be defined by corona blocking surfaces 114. Gate film 111 can be formed on a substrate 110 (e.g. a p silicon).

The deposited charges 113 on gate film 111 form a virtual electrode of an MOS capacitor, wherein the gate film 111 forms the dielectric and substrate 110 can form the other electrode of the MOS capacitor. Note that the deposited charges 113 contact the surface of gate film 111 with very low kinetic energy, thereby ensuring no damage to gate film 111.

After the deposition of corona charges, a step 102 (FIG. 1A) can measure the surface voltage of gate film 110 with a Kelvin probe. FIG. 1C illustrates a simplified Kelvin probe 120 that can measure a surface voltage associated with deposited charges 113. Specifically, Kelvin probe 120 essentially functions as a non-intrusive voltmeter with virtually infinite input impedance.

By incrementally depositing more charge and repeating the voltage measurements of steps 101 and 102, step 103 (FIG. 1A) can generate a charge-voltage (Q-V) curve. FIG. 1D illustrates an exemplary Q-V curve 130. In turn, a capacitance-voltage (C-V) curve can be derived from Q-V curve 130 in step 104 (FIG. 1A). Specifically, referring to FIG. 1D, the capacitances can be determined from a slope of an accumulation region 131 in Q-V curve 130. FIG. 1E illustrates an exemplary C-V curve 140 derived from Q-V curve 130. Unfortunately, because of the small area associated with charge deposition, it is difficult to get an accurate measure of the amount of charge deposited during step 101, thereby preventing an accurate measurement of the capacitance in step 104.

FIG. 2 illustrates a technique 200 for measuring the mobility of a substrate under a gate. In this technique 200, step 201 constructs a complete transistor connected to a pad. Step 202 then probes the pad with an electrical testing system. Technique 200, albeit accurate, has the disadvantage requiring actual construction of the complete transistor and its connected pad before the measurement can be made.

FIG. 3A illustrates a technique 300 for measuring the sheet resistance of doped regions in the semiconductor (i.e. implants). In technique 300, step 301 uses either a microwave probe or, alternatively, a four-point probe to measure the sheet resistance. FIG. 3B illustrates an exemplary microwave probe 310 including a micro-coaxial cable 311 having a center conductor 315 that provides a microwave signal and two peripheral elements 313 (e.g. providing signal-ground (S-G)). In this embodiment, microwave probe 310 can include a sleeve 312 for adjusting the pitch between center conductor 315 and peripheral elements 313.

Unfortunately, microwave probe 310 is sensitive to both the sheet resistance of the shallow implanted region as well as the sheet resistance of the substrate below the implanted layer, thereby making separation of the two effects difficult. One disadvantage of using a 4-point probe for measuring sheet resistance is that the 4-point probe must physically contact the wafer, thereby producing undesirable particles. Additionally, the 4-point probe requires an un-patterned region of several millimeters in dimension, which is not commercially viable for production wafers. Yet further, current implants of ultra-shallow junctions can be too shallow to allow an accurate and repeatable measurement, i.e. the tips of the 4-point probe can easily puncture through the entire of the implanted region into the substrate.

Therefore, a need arises for metrology techniques to accurately and efficiently perform electrical measurements on semiconductors.

SUMMARY OF THE INVENTION

A corona-microwave system can generate accurate capacitance-voltage (C-V) and resistance-voltage (R-V) curves, thereby allowing the accurate determination of gate film capacitance, sheet resistance of implanted regions, and mobility of a substrate under a gate. The corona-microwave system can advantageously combine a corona deposition system, a Kelvin probe, and a microwave probe.

Using this corona-microwave system, the corona deposition system can deposit a corona charge on a surface of the semiconductor. The Kelvin probe can be used to make a first electrical measurement of a layer of the semiconductor, whereas the microwave probe can be used to make a second electrical measurement of that layer. The steps of charge deposition and probe measurements can be repeated to generate a curve plotting the first and second electrical measurements. Because the first and second electrical measurements can be accurately made, the extracted information from the curve is also accurate.

In one embodiment for determining gate dielectric parameters, the corona charge is deposited on a test gate electrode, wherein the Kelvin probe can measure a voltage (i.e. the first electrical measurement) of a gate film formed under the test gate electrode and the microwave probe can measure a capacitance (i.e. the second electrical measurement). In this case, the microwave probe is operated in its capacitive measurement mode by measuring a shift in resonant frequency of its microwave cavity as the microwave probe is pulled up from the gate film. Thus, in this embodiment, the corona-microwave system can generate an accurate capacitance-voltage (C-V) curve from which accurate gate parameters can be extracted.

In another embodiment for determining sheet resistance, the corona charge is deposited on an implant region, wherein the Kelvin probe can measure a voltage (i.e. the first electrical measurement) of the implant region and the microwave probe can measure a resistance (i.e. the second electrical measurement) of the implant region. In this case, the microwave probe is operated in its resistance measurement mode by measuring a shift in resonant frequency and a change in a quality factor of its microwave cavity as the microwave probe is pulled up from the implant region. Thus, in this embodiment, the corona-microwave system can generate an accurate resistance-voltage (R-V) curve from which an accurate sheet resistance can be extracted.

In yet another embodiment for determining relative mobility, the corona charge is deposited on a gate film, wherein the Kelvin probe can measure a voltage (i.e. the first electrical measurement) of the gate film and the microwave probe can measure a resistance (i.e. the second electrical measurement) of the gate film. In this case, the microwave probe is operated in its resistance measurement mode by measuring a shift in resonant frequency and a change in a quality factor of its microwave cavity as the microwave probe is pulled up from the gate film. Thus, in this embodiment, the corona-microwave system can generate an accurate resistance-voltage (R-V) curve from which an accurate relative mobility can be extracted.

DETAILED DESCRIPTION OF THE FIGURES

A corona-microwave probe system can make accurate electrical measurements. Using these accurate electrical measurements, the corona-microwave system can generate accurate information regarding gate dielectric parameters, the mobility of a substrate, and the sheet resistance of implant regions. As described in further detail below, the corona-microwave probe system can advantageously make capacitance measurements directly, rather than by derivation, thereby improving accuracy. Moreover, the corona-microwave probe system can advantageously eliminate the need to construct a physical transistor connected to a pad to measure substrate mobility as well as the need to physically contact the wafer to measure sheet resistance.

Figure 1A:
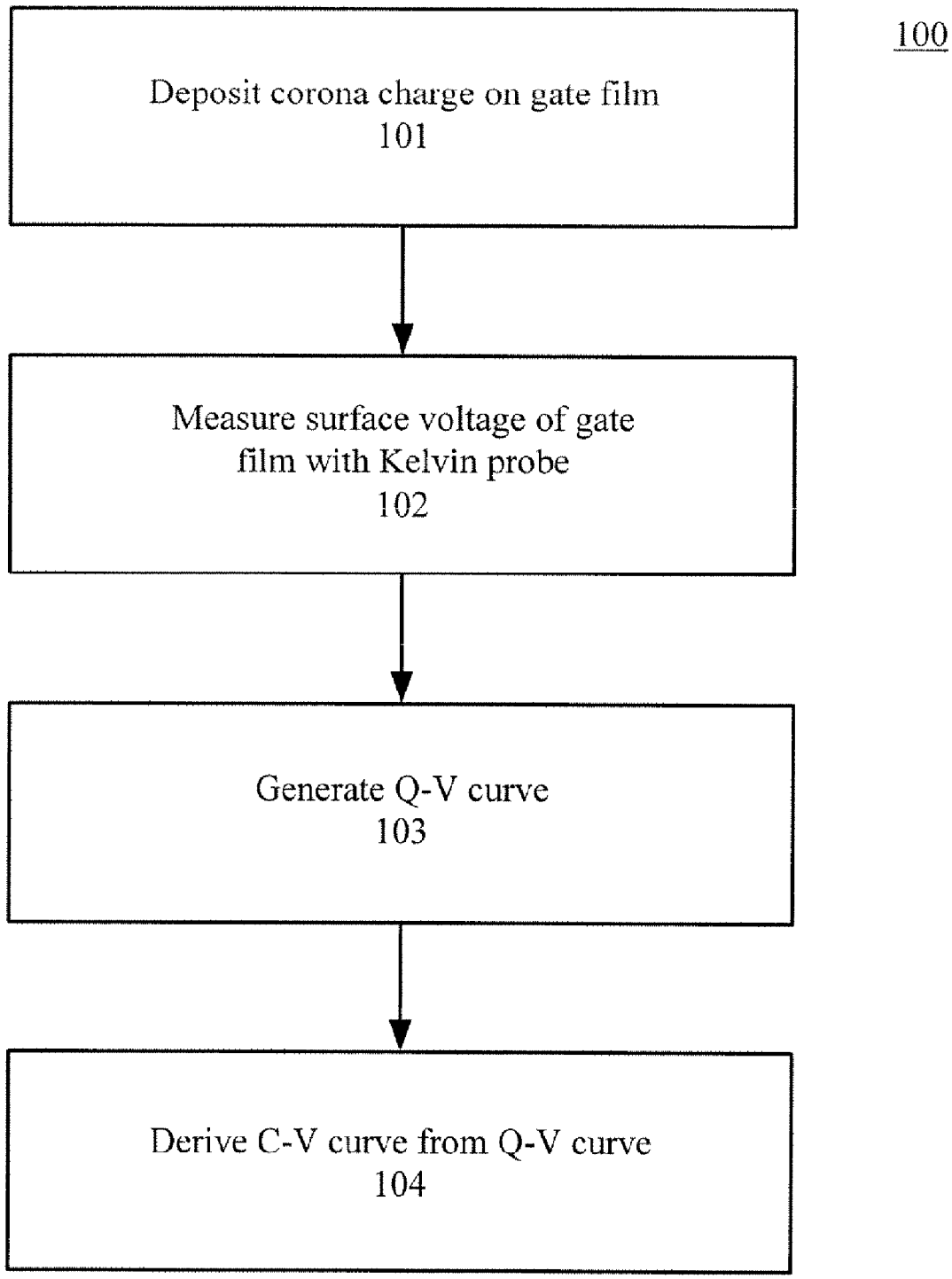
FIG. 1A illustrates a prior art technique that can measure the capacitance versus voltage of a gate film.
Figure 1C:
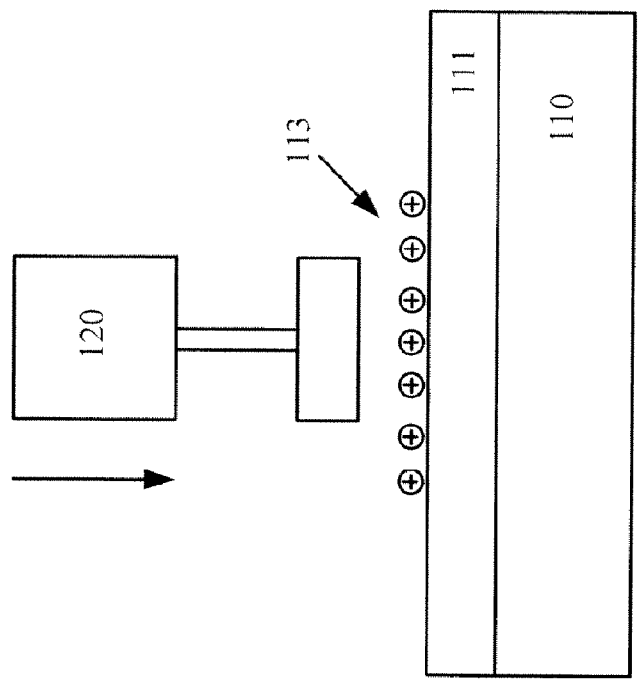
FIG. 1C illustrates a simplified Kelvin probe that can measure a surface voltage associated with the deposited charges.
Figure 1B:
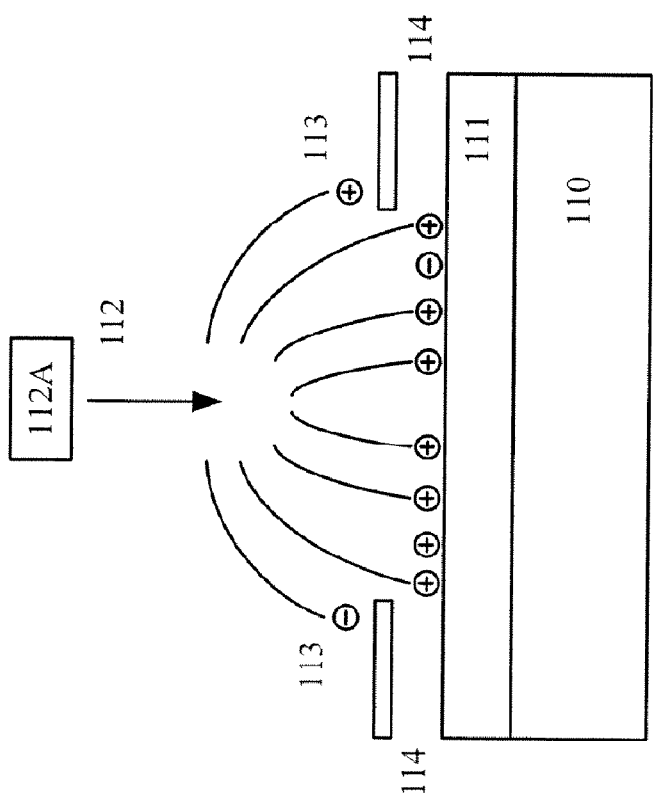
FIG. 1B illustrates an exemplary corona bias in which a corona generator can produce ions that deposit precise amounts of charge on a gate film.
Figure 1E:
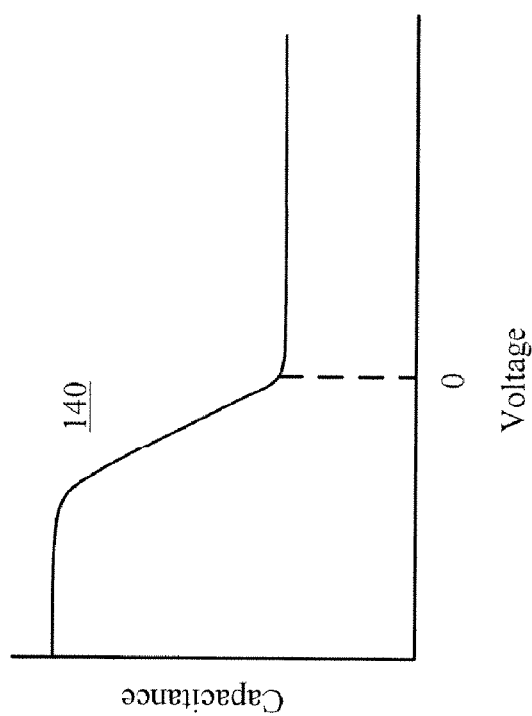
FIG. 1E illustrates an exemplary C-V curve.
Figure 1D:
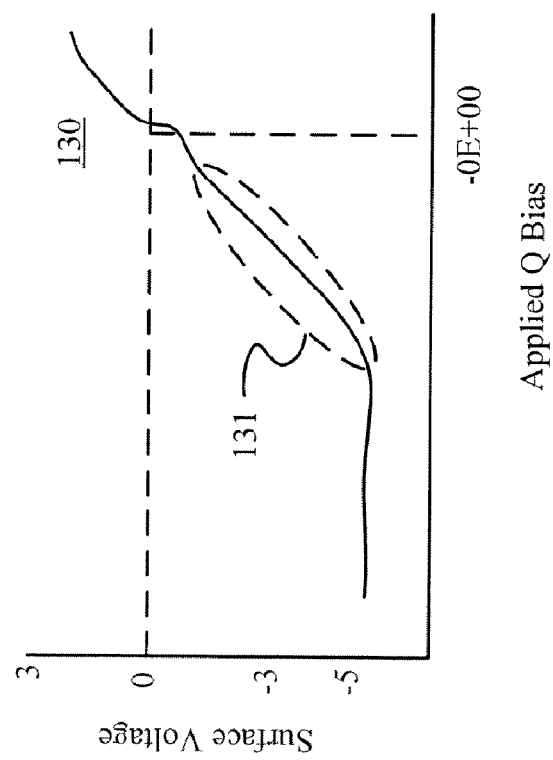
FIG. 1D illustrates an exemplary Q-V curve.
Figure 2:
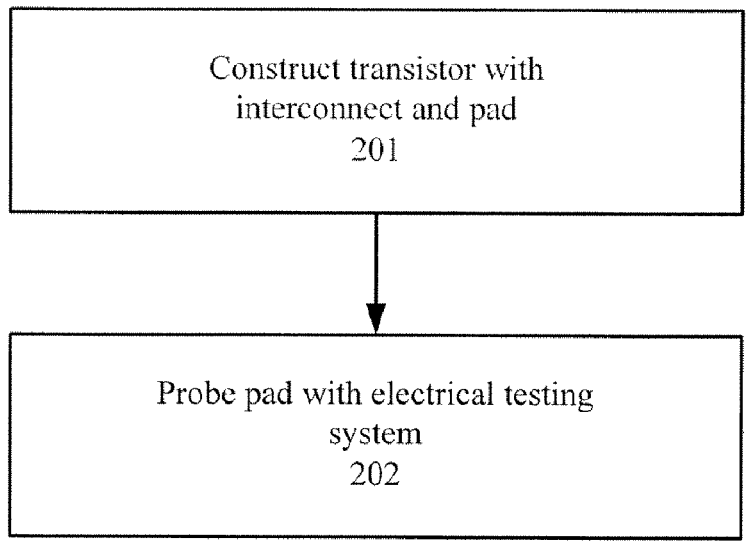
FIG. 2 illustrates a prior art technique for measuring the mobility of a substrate under a gate.
Figure 3A:
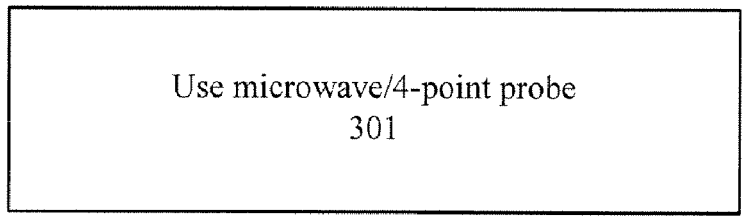
FIG. 3A illustrates a prior art technique for measuring the sheet resistance of implants.
Figure 3B:
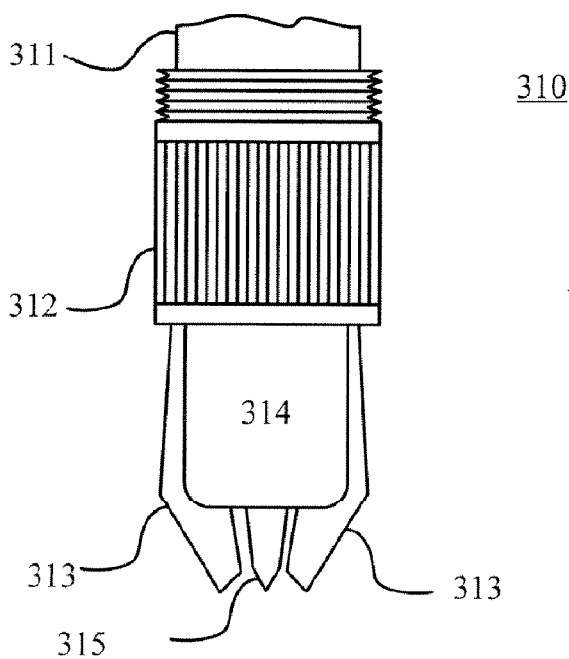
FIG. 3B illustrates an exemplary microwave probe.
Figure 4A:
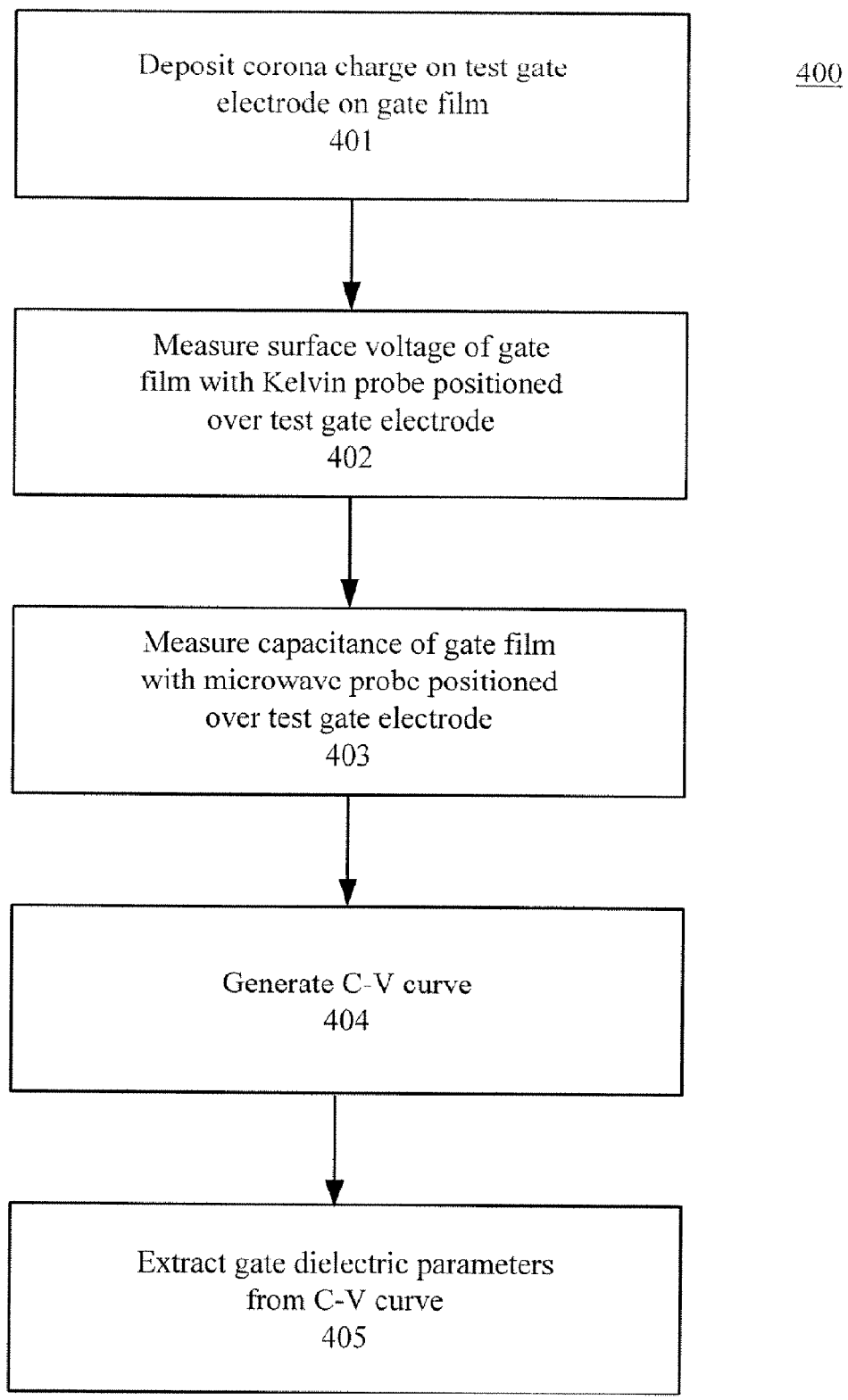
FIG. 4A illustrates a technique for generating an accurate C-V curve in accordance with one embodiment of the invention.

FIG. 4A illustrates a technique 400 for generating an accurate C-V curve. In technique 400, step 401 can deposit corona charge on a test gate electrode structure formed on a gate film. In step 402, a Kelvin probe, which is positioned over the test gate electrode structure, can be used to measure the surface voltage of the gate film. In step 403, a microwave probe, which is positioned over the test gate electrode structure, can be used to measure the capacitance of the gate film. Specifically, the microwave probe can be operated in its capacitive measurement mode by measuring the shift in resonant frequency of the microwave cavity as the microwave probe is pulled up from the test gate electrode structure and the gate film. Note that a gate electrode structure is necessary to limit the lateral extent of the measurement to an area smaller than the area covered by the microwave probe. Specifically, if the lateral extent is not limited, then the total capacitance is too large to measure due to the very small thickness of the gate film. Notably, using this configuration, both voltage and capacitance can be accurately determined despite the small area used for measurement.

The operation and construction of an exemplary microwave probe having this capability are discussed in detail, for example, in U.S. Pat. Nos. 6,680,617 and 6,597,185, and in U.S. Patent Application Publication Nos. 2004/0100279, 2004/0004484, and 2003/0155934, all of which are incorporated by reference herein. Neocera currently manufactures such a microwave probe under the product name NeoMetrik™.

Figure 4B:
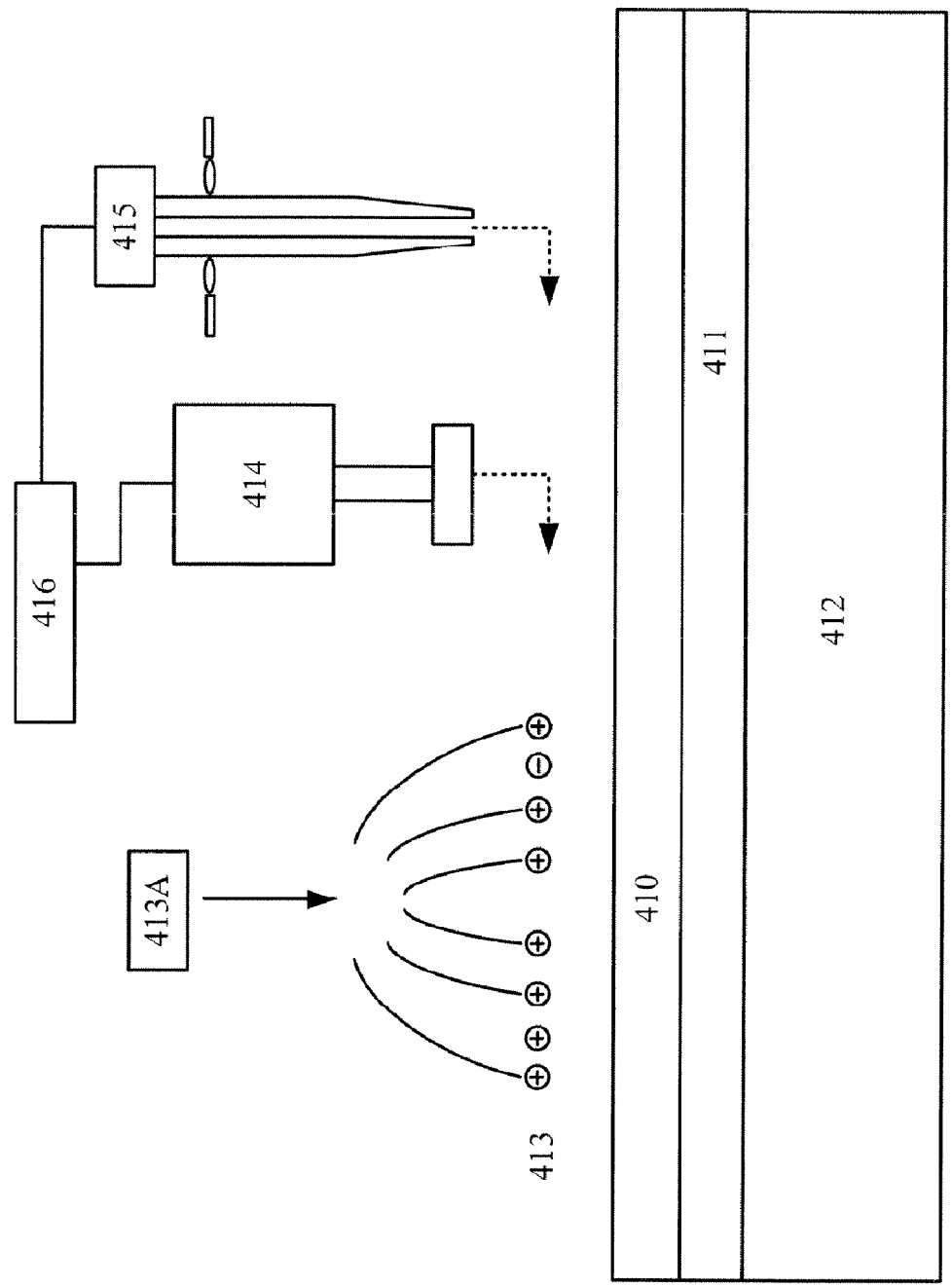
FIG. 4B illustrates a corona-microwave probe system in accordance with one embodiment of the invention.

FIG. 4B illustrates a simplified test gate electrode structure 410 formed on a gate film 411, which in turn is formed on a substrate 412. After a corona charge 413 is deposited on gate electrode structure 410 using a corona charge generator 413A, a Kelvin probe 414 and a microwave probe 415 can be positioned over the charged region of test gate electrode structure 410 and then used to directly measure voltage and capacitance, respectively, of gate film 411. An analysis module 416 can use the electrical measurements taken by Kelvin probe 414 and microwave probe 415 to generate the C-V curve and extract the gate dielectric parameters from that C-V curve.

Note that both Kelvin probe 414 and microwave probe 415 can advantageously provide these measurements without touching test gate electrode structure 410. In one embodiment, these probes can be positioned within 100 nm of test gate electrode structure 410. Note that the structures and probes of FIG. 4B are shown in dramatically different scales to show deposited charges 413 and test gate electrode structure 410. Specifically, in accordance with one embodiment of the invention, test gate electrode structure 410 preferably has a geometry that approximately matches microwave probe 415 and also keeps the total capacitance around 10e-15 F. For example, the end of microwave probe 415 could have a size of approximately 1 um×8 um, with 8 um spacing between conductors (two shown in microwave probe 415). In this case, test gate electrode structure 410 could have a size of approximately 50 nm×8 um.

In one embodiment, test gate electrode structure 410 can be completely covered by deposited charge 413. In yet another embodiment, the region covered by deposited charge 410 can be significantly larger than test gate electrode structure 410. For example, a region having a size or approximately 70 um×70 um is commercially implementable.

By depositing corona charge onto the test gate electrode structure formed on the gate film, and after each charge deposition, measuring the surface voltage of the gate film using the Kelvin probe as well as the surface capacitance of the film using the microwave probe, step 404 can generate an accurate C-V curve. That is, because both the capacitance and voltage of the gate film can be directly measured, the resulting C-V curve is significantly more accurate than the C-V curve derived from the Q-V curve (wherein Q, i.e. charge, can be difficult to accurately measure for small areas).

Referring back to FIG. 4A, in step 405, using this C-V curve, one or more parameters of the gate film can be extracted from the curve. Exemplary parameters can include, but are not limited to, equivalent oxide thickness (EOT), trapped interface charge (Dit), and leakage.

Figure 5A:
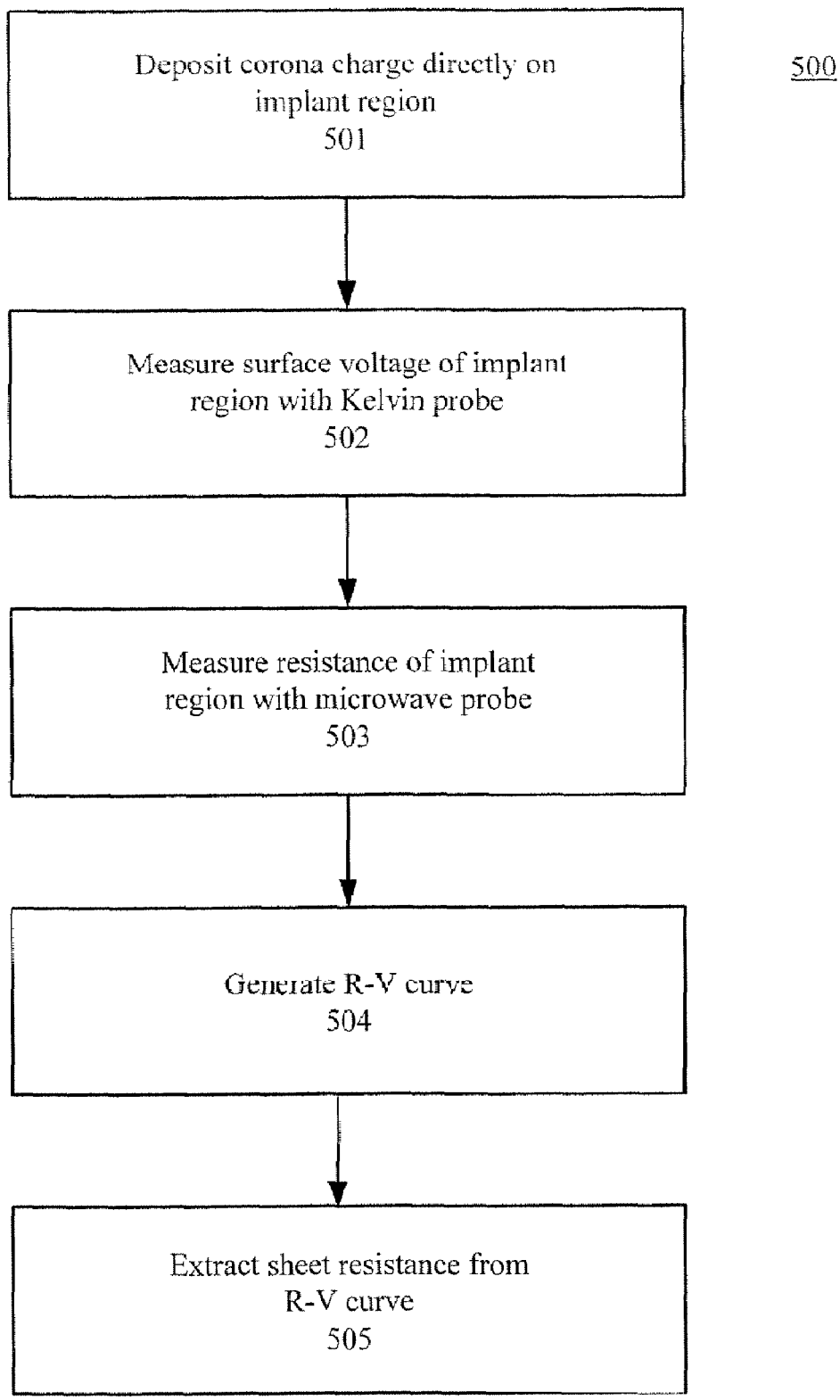
FIG. 5A illustrates a technique for measuring sheet resistance of implants in accordance with the invention.

FIG. 5A illustrates a technique 500 for measuring the sheet resistance of an implant region. Note that technique 500 does not require a test gate electrode structure. In technique 500, step 501 can deposit corona charge directly on an implant region of a substrate. In step 502, a Kelvin probe can be used to measure the surface voltage above the implant region. In step 503, a microwave probe can be used to measure the resistance of the implant region. Specifically, the microwave probe can be operated in its resistance measurement mode by measuring both the shift in resonant frequency and the change in quality factor of its microwave cavity as the microwave probe is pulled up from the implant region.

Notably, an implant region not only changes the resistivity of the surface of the substrate, the implant also creates a p-n junction with a charge depletion region formed at its interface. This charge depletion region acts as a barrier to current depending on its thickness. For example, if an n-type implant in a p-type substrate is biased with a positive voltage relative to the underlying substrate, then the p-n junction is reverse biased.

By suitably biasing the implant region (i.e. to be reverse biased) and then depositing the corona charge, the implant region and the underlying substrate each have a respective resistance whereas the depletion region associated with the interface has a capacitance. As this interface becomes more reversed biased, the depletion region increases in depth and the capacitance decreases. This capacitance is in series with the bulk conductance. Therefore, as the capacitance decreases, the contribution of the bulk conductance to the overall conductance decreases. Because this capacitance is correlated to the surface voltage, as the surface voltage changes so does the interface capacitance. This correlation allows the resistances of the implant region and the underlying substrate to be distinguished.

By measuring the surface voltage and resistance after each charge deposition, step 504 can accurately generate a resistance vs. surface voltage (R-V) curve. Step 505 can then extract the sheet resistance of the implant region from the R-V curve.

Figure 5C:
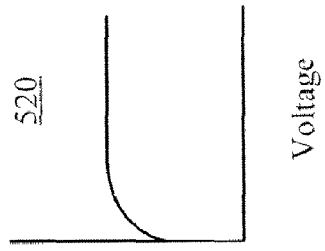
FIG. 5C illustrates an exemplary R-V curve.
Figure 5B:
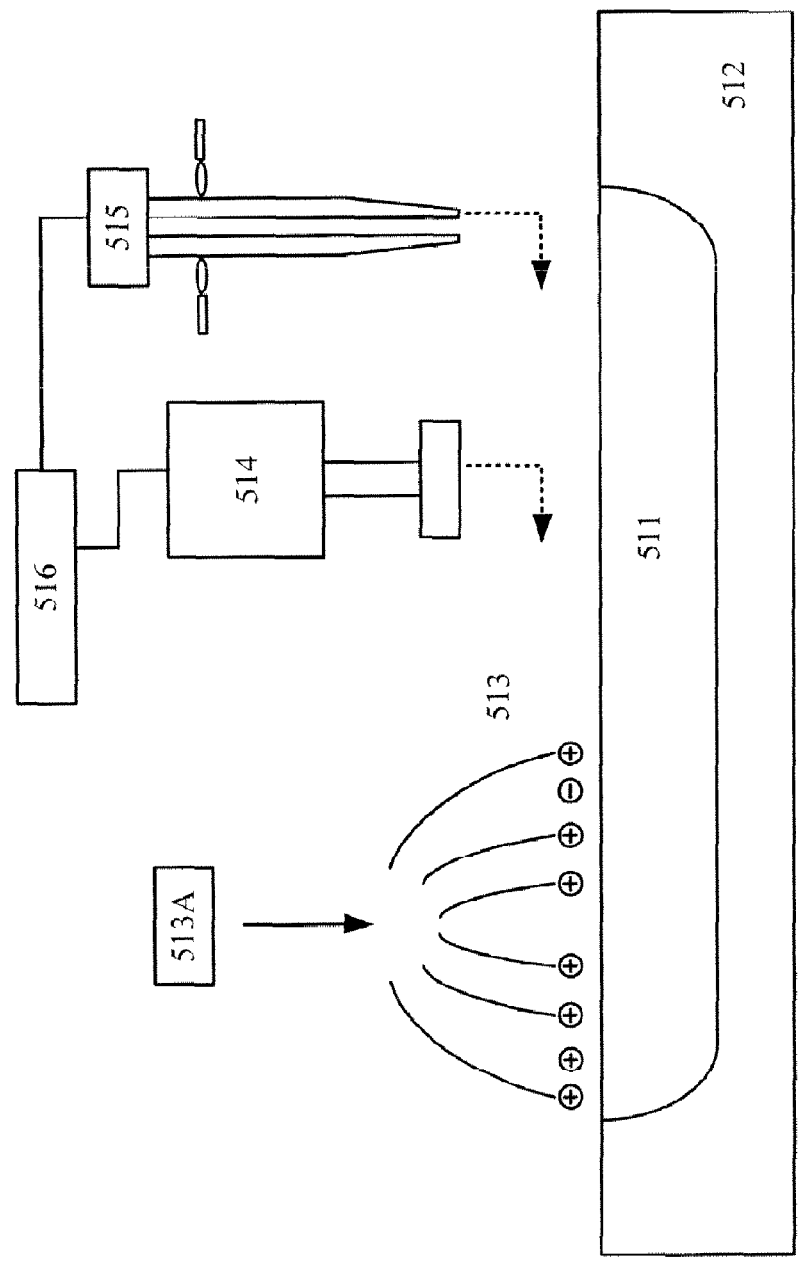
FIG. 5B illustrates another corona-microwave probe system in accordance with one embodiment of the invention.

FIG. 5B illustrates an implant region 511 formed in a substrate 512. After a corona charge 513 is deposited on implant region 511 using a corona charge generator 513A, a Kelvin probe 514 and a microwave probe 515 can be used to directly measure voltage and resistance, respectively, of implant region 511. An analysis module 516 can use the electrical measurements taken by Kelvin probe 514 and microwave probe 515 to generate the R-V curve and then extract the sheet resistance from that R-V curve. FIG. 5C illustrates an exemplary R-V curve 520.

Note that both Kelvin probe 514 and microwave probe 515 can advantageously provide these measurements without touching implant region 511. In one embodiment, these probes can be positioned within 100 nm of implant region 511. Note that although charge 513, Kelvin probe 514, and microwave probe 515 are shown in different positions over implant region 511, the actual positions could be the same or substantially the same position. In one embodiment, the end of microwave probe 515 could have a size of approximately 50 um×50 um, wherein the area of implant region 511 covered by charge 513 could be at least slightly larger than that size.

Figure 6A:
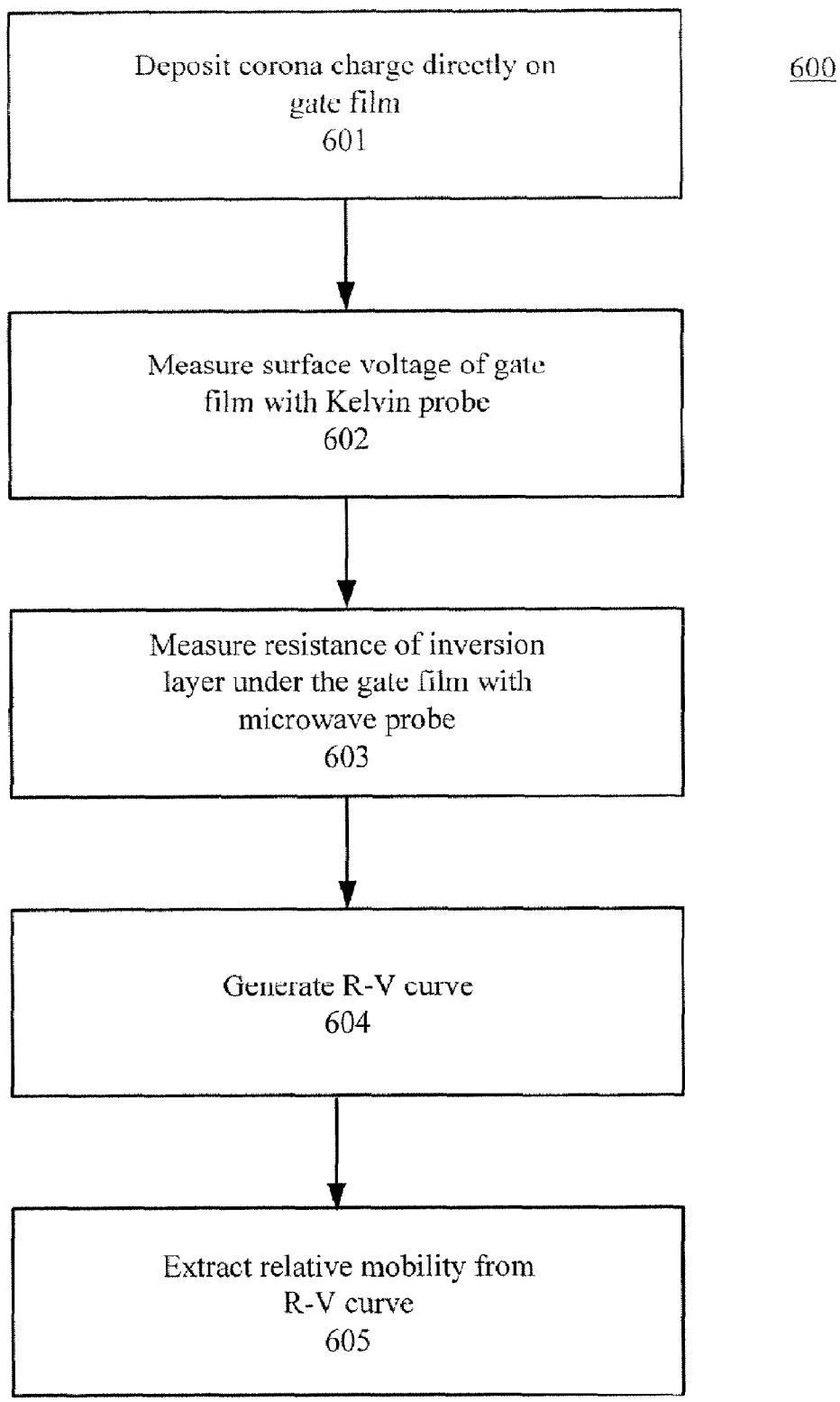
FIG. 6A illustrates a technique for measuring relative mobility of the substrate in accordance with one embodiment of the invention.

FIG. 6A illustrates a technique 600 for measuring the relative mobility of a substrate. Note that technique 600 also does not require a test gate electrode structure. In technique 600, step 601 can deposit corona charge directly on a gate film formed on a substrate. In one embodiment, the area of the gate film having the deposited charge has enough charge to bring the substrate into inversion, i.e. create an inversion layer. In step 602, a Kelvin probe can be used to measure the surface voltage above the gate film. In step 603, a microwave probe can be used to directly measure the resistance of the inversion layer under the gate film. Specifically, the microwave probe can be operated in its resistance measurement mode by measuring both the shift in resonant frequency and the change in quality factor of its microwave cavity as the microwave probe is pulled up from the implant region.

By measuring the surface voltage and resistance after each charge deposition, step 604 can accurately generate a resistance vs. surface voltage (R-V) curve. Step 605 can then extract the relative mobility of the substrate from the R-V curve. Note that because the corona-microwave system described herein can generate its results without measuring charge, this mobility is not an absolute mobility (which in part is defined by charge density) but is instead a relative mobility (i.e. by calibrating one wafer against a standard or by comparing one wafer to another wafer).

Figure 6B:
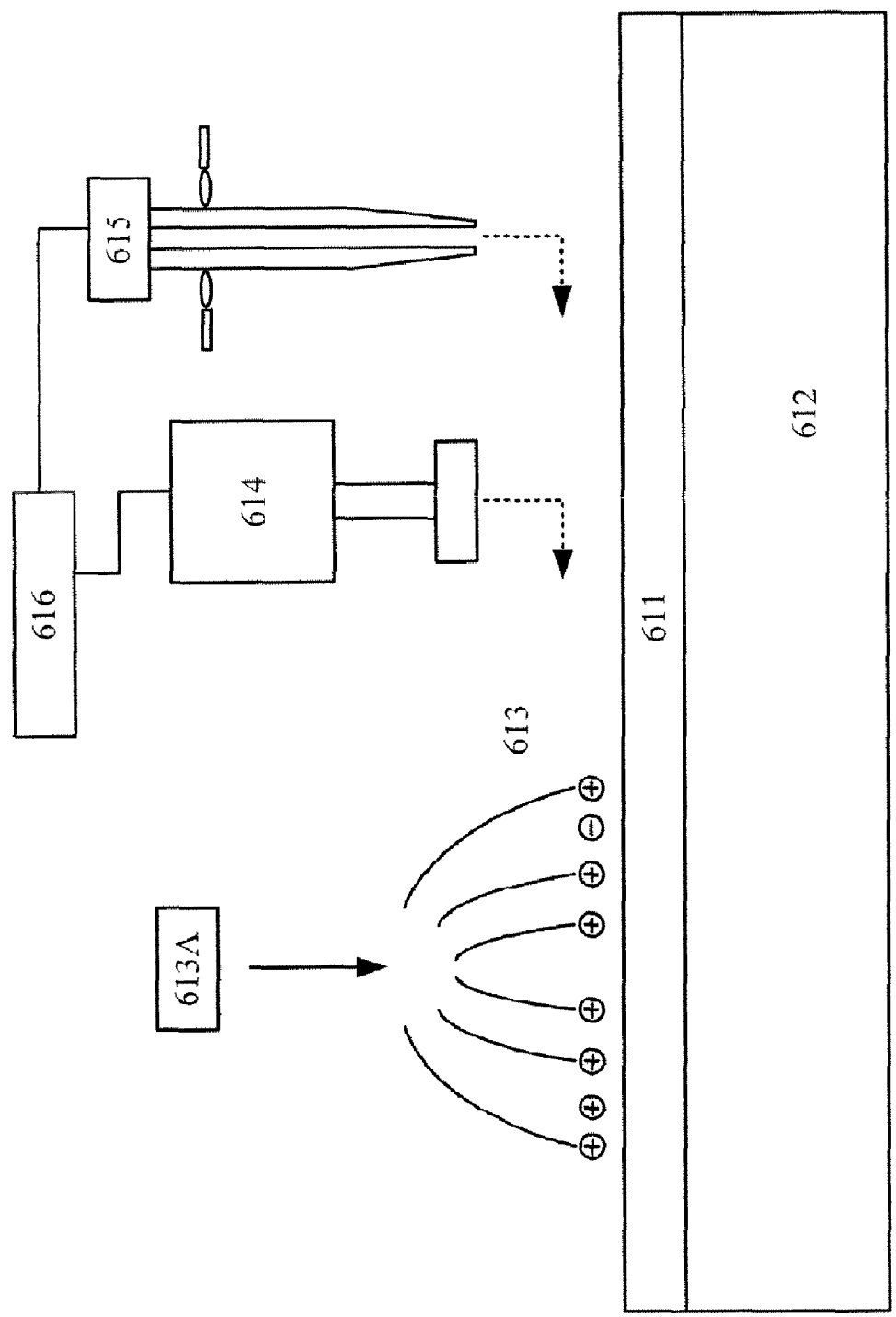
FIG. 6B illustrates yet another corona-microwave probe system in accordance with one embodiment of the invention.

FIG. 6B illustrates a gate film 611 formed on a substrate 612. After a corona charge 613 is deposited on gate film 611 using a corona charge generator 613A, a Kelvin probe 614 and a microwave probe 615 can be used to directly measure voltage and resistance, respectively, on gate film 611. An analysis module 616 can use the electrical measurements taken by Kelvin probe 614 and microwave probe 615 to generate the R-V curve and extract the relative mobility from that R-V curve.

As described above, both Kelvin probe 614 and microwave probe 615 can advantageously provide these measurements without touching gate film 611. In one embodiment, these probes can be positioned within 100 nm of gate film 611. Note that although charge 613, Kelvin probe 614, and microwave probe 615 are shown in different positions over gate film 611, the actual positions could be the same or substantially the same position. In one embodiment, the end of microwave probe 615 could have a size of approximately 50 um×50 um, wherein the area of gate film 611 covered by charge 613 could be at least slightly larger than that size.

The corona-microwave system described above provides distinct advantages over the prior art systems. For example, with respect to generating C-V curves, the corona-microwave system can directly measure the capacitance, thereby eliminating the difficult task of trying to determine the amount of deposited corona charge. Instead, only the surface voltage and the microwave capacitance are used to determine the dielectric parameters. Further, with respect to determining mobility, the corona-microwave system does not require the fabrication of a transistor and its connected pad. Thus, the relative mobility measurement can made much earlier in the production cycle, i.e. just after deposition of the gate film. Yet further, with respect to determining sheet resistance, the corona-microwave system does not require contact with the wafer and can distinguish between implant and substrate sheet resistances.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. Accordingly, it is intended that the scope of the invention be defined by the following claims and their equivalents.

The invention claimed is:

1. A method for generating an accurate capacitance-voltage (C-V) curve for a semiconductor, the method comprising:
   (a) depositing a corona charge on a test gate electrode structure formed on a gate film;
   (b) using a Kelvin probe to measure a surface voltage of the gate film;
   (c) using a microwave probe to measure a capacitance of the gate film;
   (d) repeating steps (a), (b), and (c) to generate the C-V curve.

2. The method of claim 1, further including extracting gate dielectric parameters from the C-V curve.

3. The method of claim 1, wherein in step (c) the microwave probe is operated in its capacitive measurement mode by measuring a shift in resonant frequency of a microwave cavity as the microwave probe is pulled up from the gate film.

4. The method of claim 1, wherein the Kelvin and microwave probes are positioned within 100 nm of the test gate electrode structure.

5. The method of claim 1, wherein the test gate electrode structure has a geometry that approximately matches an end of the microwave probe and also keeps a total capacitance around 10e-15 F.

6. The method of claim 1, wherein an end of the microwave probe has a size of approximately 1 um×8 um, with 8 um spacing between conductors.

7. The method of claim 6, wherein the test gate electrode structure has a size of approximately 50 nm×8 um.

8. The method of claim 1, wherein a region covered by the corona charge is significantly larger than the test gate electrode structure.

9. The method of claim 8, wherein the region covered by the corona charge has a size of approximately 70 um×70 um and the test gate electrode structure has a size of approximately 50 nm×8 um.

10. A method for extracting accurate parameters for a semiconductor, the method comprising:
   (a) depositing a corona charge on a surface of the semiconductor;
   (b) using a Kelvin probe to measure a first electrical characteristic of a layer of the semiconductor;
   (c) using a microwave probe to measure a second electrical characteristic of the layer;
   (d) repeating steps (a), (b), and (c) to generate a curve plotting the first and second electrical characteristics; and
   (e) extracting the accurate parameters from the curve.

* * * * *